United States Patent
O'Brien et al.

(10) Patent No.: US 12,395,176 B2
(45) Date of Patent: Aug. 19, 2025

(54) MULTIPLE SAMPLE-RATE DATA CONVERTER

(71) Applicant: Tektronix, Inc., Beaverton, OR (US)

(72) Inventors: Joshua J. O'Brien, Aloha, OR (US);
Timothy E. Bieber, Portland, OR (US);
Barton T. Hickman, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 3 days.

(21) Appl. No.: 17/845,896

(22) Filed: Jun. 21, 2022

(65) Prior Publication Data

US 2022/0407523 A1 Dec. 22, 2022

Related U.S. Application Data

(60) Provisional application No. 63/212,574, filed on Jun. 18, 2021.

(51) Int. Cl.
*H03L 7/07* (2006.01)
*H03L 7/14* (2006.01)

(52) U.S. Cl.
CPC .............. *H03L 7/07* (2013.01); *H03L 7/148* (2013.01)

(58) Field of Classification Search
CPC ................................ H03L 7/148; H03L 7/07
See application file for complete search history.

(56) References Cited

U.S. PATENT DOCUMENTS

| 5,512,895 | A | 4/1996 | Madden et al. |
| 9,651,579 | B2 | 5/2017 | Hickman et al. |
| 10,727,855 | B2* | 7/2020 | Sugiyama ........... H03M 1/1245 |
| 10,763,865 | B1* | 9/2020 | Badizadegan .......... H03L 7/089 |

(Continued)

FOREIGN PATENT DOCUMENTS

| EP | 0652442 | 5/1995 |
| JP | 2008182494 | 8/2008 |

OTHER PUBLICATIONS

Korean Intellectual Property Office, International Search Report and Written Opinion for International Application PCT/US2022/034405, Oct. 4, 2022, 10 pages, Daejeon, Republic of Korea.

*Primary Examiner* — Menatoallah Youssef
*Assistant Examiner* — Khareem E Almo
(74) *Attorney, Agent, or Firm* — Miller Nash LLP; Andrew J. Harrington

(57) ABSTRACT

A test and measurement instrument includes a first data channel including a first data converter operating at a first rate, and a second data channel including a second data converter operating at a second rate that is different than the first rate. Rate controls may include a clock generation circuit. The clock generation circuit includes an intermediate frequency generator structured to generate an intermediate frequency clock from a first clock reference signal, a first frequency clock generator structured to generate a first frequency clock directly from the intermediate frequency clock, and a second frequency clock generator structured to generate a second frequency clock directly from the intermediate frequency clock. The first frequency clock may be used to control the rate of the first data channel, and the second frequency clock may be used to control the rate of the second data channel. Methods are also described.

26 Claims, 8 Drawing Sheets

(56) References Cited

U.S. PATENT DOCUMENTS

| | | | |
|---|---|---|---|
| 11,239,877 B1* | 2/2022 | Chopra | H04B 1/0003 |
| 11,262,737 B2* | 3/2022 | Cella | H03M 1/12 |
| 2006/0182209 A1* | 8/2006 | Coyne | H04L 27/2657 |
| | | | 375/349 |
| 2009/0045994 A1* | 2/2009 | Drummy | G01N 29/262 |
| | | | 341/155 |
| 2022/0322260 A1* | 10/2022 | Zhuge | H04W 56/005 |

* cited by examiner

MULTIPLE SAMPLE-RATE DATA CONVERTER

CROSS-REFERENCE TO RELATED APPLICATIONS

This disclosure claims benefit of U.S. provisional application Ser. No. 63/212,574, titled "MULTIPLE SAMPLE-RATE DATA CONVERTER," filed on Jun. 18, 2021, the disclosure of which is incorporated herein by reference in its entirety.

TECHNICAL FIELD

This disclosure relates to test and measurement instruments, and more particularly to a system for converting analog signals to digital signals or digital signals to analog signals in multiple channels having different sample rates.

BACKGROUND

High channel count oscilloscopes, digitizers, and arbitrary waveform generators are growing in response to many customer applications that require more than the typical one to four input and/or output channels traditionally offered on present test and measurement instruments. Many midrange sample rate products having more than four channels have been brought to market to meet this need. But, these midrange products are incapable of sampling test signals at rates high enough for some applications.

As the demand for higher sample rates grows, a more complicated storage controller and more memory devices are needed to sample the signals on each of the channels at the higher rate. For example, with higher sample rates, a channel having a single digitizer cannot achieve the desired sample rate, and so multiple digitizers are multiplexed, or interleaved, together to achieve the desired sample rate. Requiring multiple digitizers increases the cost and complexity of each channel, which adds to the cost of the high-bandwidth multiplexing device. In addition to increased costs, requiring multiple components increases the power consumed by such devices, which also increases the heat generated by these high power devices. Another disadvantage is that requiring multiple components generally increases the size of the devices, which is also preferably avoided. So, as the sample rate requirements of the product increases, including more than four high-rate channels becomes much less practical, or even impossible, if low power, low heat, and low cost are to be preserved.

In some cases it would be desirable to include a mixture of high and low sample rate channels in a single test and measurement instrument. In such a device a first, slower, clock would be used to drive the sampling circuits in the lower sample rate channels, and a second, faster clock would be used to drive the sampling circuits in the faster sample rate channels. A first significant problem with such an implementation is keeping such clocks aligned, which is difficult to achieve with precision if the slow and fast clocks are independently generated. Even when the slow and fast clocks are generated from a same base oscillator, which may help with alignment, merely multiplying the slow clock to produce the fast clock would generate far too much jitter to allow the slow and fast channels to be tightly aligned. This is due to the fact that the jitter of the slow clock would be significantly magnified or multiplied in such a clock multiplication scenario.

Embodiments according to this disclosure address these and other limitations with conventional test and measurement instruments.

DESCRIPTION

Figure 1:
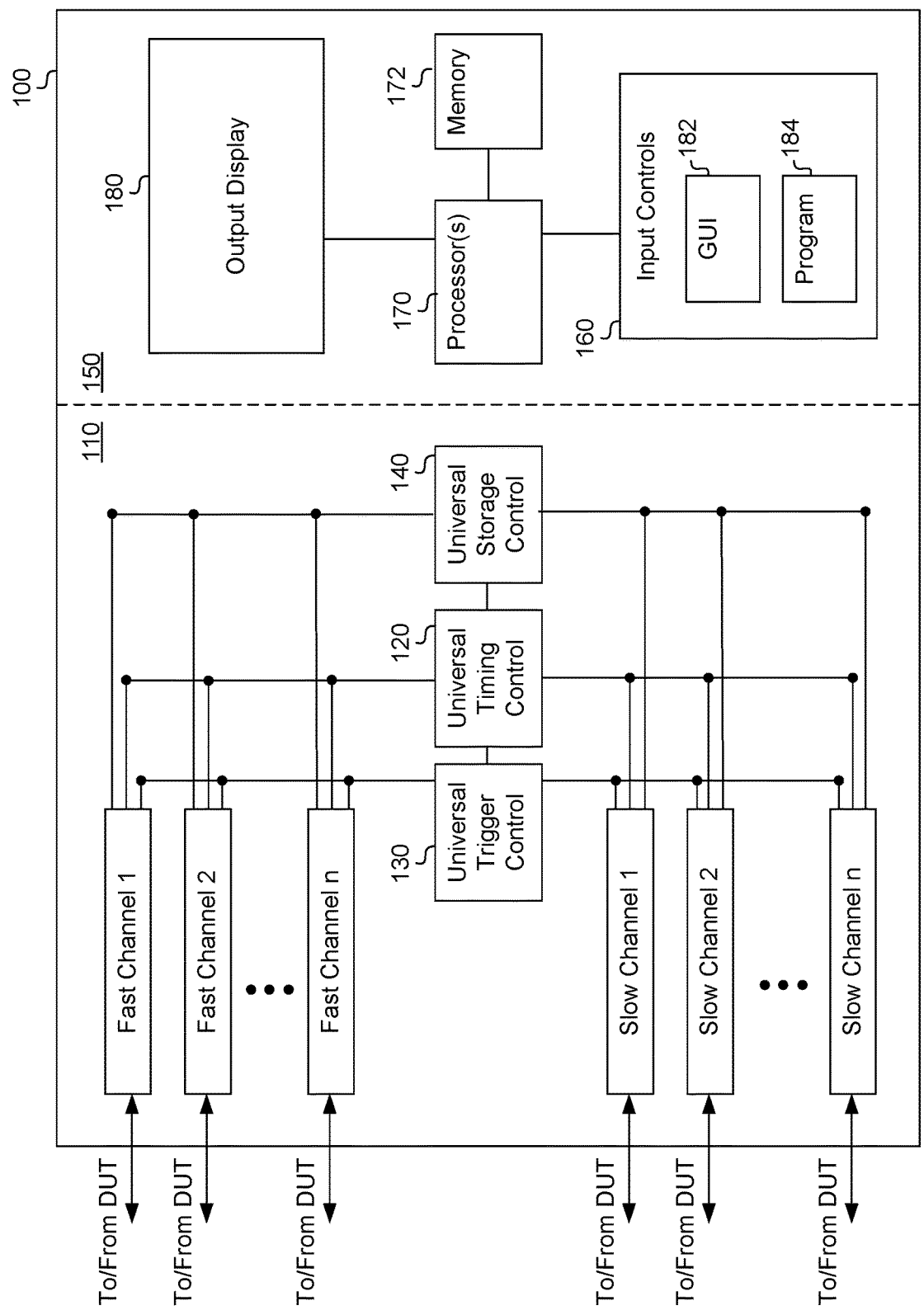
FIG. 1 is a block diagram of a test and measurement instrument having a multiple sample-rate data converter according to embodiments of the disclosure.

FIG. 1 is a block diagram of a test and measurement instrument 100 having a multiple sample-rate data converter according to embodiments of the disclosure. The illustrated test and measurement instrument, which is also referred to as the instrument 100 of FIG. 1, includes an input/output portion 110 as well as a display and control portion 150. The input/output portion 110 of the instrument 100 includes multiple high-speed channels, also referred to as fast channels, labeled as Fast Channel 1, Fast Channel 2, and Fast Channel n. Of course, any number of high-speed channels may be included in the instrument 100 depending on the implementation. The input/output portion 110 of the instrument 100 also includes multiple low-speed channels, also referred to as slow channels, labeled as Slow Channel 1, Slow Channel 2, and Slow Channel n. Similar to the fast channels, the instrument 100 may include any number of low-speed, or slow, channels. In some embodiments there may be more high-speed channels than low-speed channels, although in other embodiments there may be more low-speed channels than high-speed channels in a single instrument 100.

As described in more detail below, one or more of a universal timing control 120, a universal trigger control 130, and a universal storage control 140 may be present in the instrument 100. In FIG. 1 these components are illustrated as being within the input/output portion 110 of the instrument 100, but they could be physically located anywhere in the instrument 100.

The control portion 150 of the instrument 100 may be conventional, other than being able to control the multiple high-speed and low-speed input channels described above. The control portion 150 includes a set of input controls 160, through which a user can control the instrument. The input controls 160 may include a Graphical User Interface (GUI) 182 or a programmatic interface 184. Other input controls 160 may include various knobs and switches on or remote from the instrument 100 as is conventionally known.

One or more main processors 170 may be configured to execute instructions from a memory 172 and may perform any methods and/or associated steps indicated by such instructions, such as receiving and storing the acquired signals from the input/output portion 110, or performing any test and measurement functions of the instrument 100. The acquired signals may be stored as waveforms in the memory 172, in one or more acquisition memories associated with the channels, or in other various memories that may be located throughout the instrument 100.

An output display 180 may be controlled by the one or more processors 170 to display waveforms, measurements, and other data to the user. The output display 180 may be, for example, an LCD or any other display monitor. In some embodiments the output display 180 is located remote from the instrument 100. The representations of the output display 180 may be copied to other displays remote from the instrument 100, including being sent through local or cloud networks to other devices coupled to the instrument.

While the components of the test and measurement instrument 100 are depicted as being integrated within test and measurement instrument 100, it will be appreciated by a person of ordinary skill in the art that any of these components can be external to the test and measurement instrument 100 and can be coupled to the test and measurement instrument 100 in any conventional manner (e.g., wired and/or wireless communication media and/or mechanisms). In some embodiments a remote computer may connect to the instrument 100 to operate the instrument.

Figure 2:
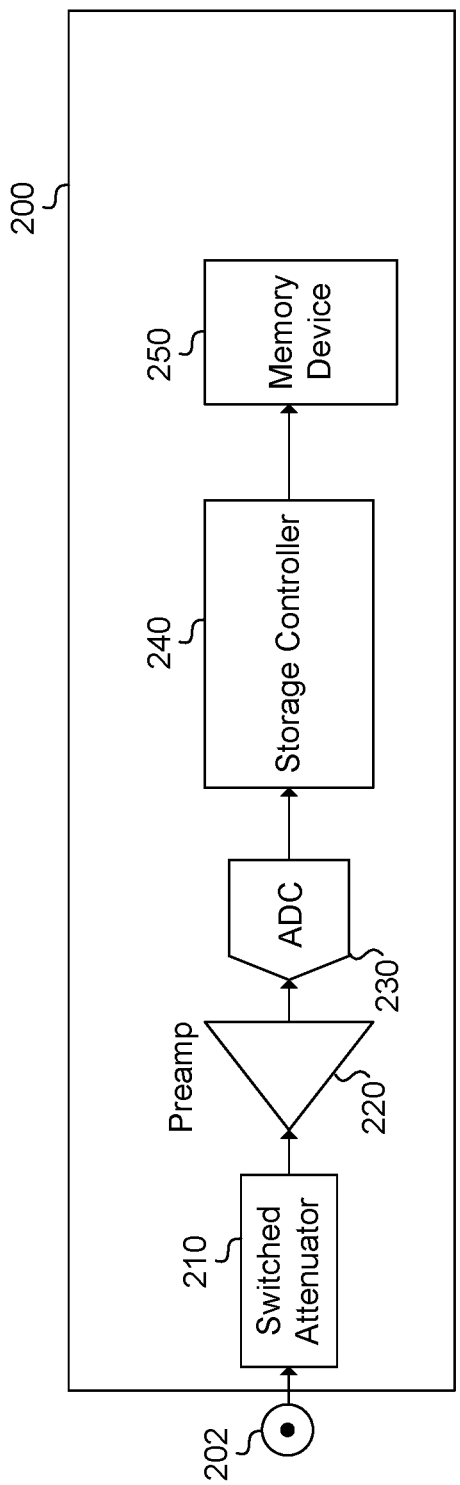
FIG. 2 is a block diagram illustrating example components of a low sample-rate input channel, according to embodiments.

FIG. 2 is a block diagram illustrating example components of a low sample-rate input channel 200, which may be an example of any of the Slow Channels of FIG. 1, according to embodiments. The input channel 200 receives input from an input port 202, which may be coupled to a Device Under Test (DUT). In general, the input channel 200 receives an input signal from the DUT, digitizes the signal into an input waveform, and then stores the waveform for use by the instrument 100 (FIG. 1). The input channel 200 optionally includes an attenuator 210, which works in conjunction with a preamplifier 220 to amplify or attenuate the input signal from the DUT to a desired amplitude for processing. Next, an Analog to Digital Converter (ADC) 230 converts the analog input signal to a digital signal, which also may be called the input waveform. An ADC may also be referred to herein as a data converter. The ADC 230 operates at a frequency, clock rate, or sampling rate that is matched to the speed at which the input signal changes. In general, as the input channel 200 is a low-speed channel, the ADC 230 will generally be configured to operate at a relatively low sampling rate. Sampling rates for a low-speed channel may be between 10 KHz-2 GHz, for example. The sampling rate of the ADC 230 is generally set such that the Nyquist frequency, which is half the sampling rate, is lower than the analog bandwidth of the input channel. The sampling rate of the input channel 200 may be controlled by a clock, described in detail below. The ADC 230 could be a single high-resolution analog-to-digital converter, such as an 8-bit, 10-bit, or 12-bit analog-to-digital converter. After the input signal is sampled to an input waveform by the ADC 230, a storage controller 240 manages storing the input waveform into a memory device 250. The storage controller 240 may also be controlled by a clock, which may be the same clock that operates the ADC 230. In other embodiments the clock for the storage controller 240 is separate from the clock that operates the ADC 230.

Figure 3:
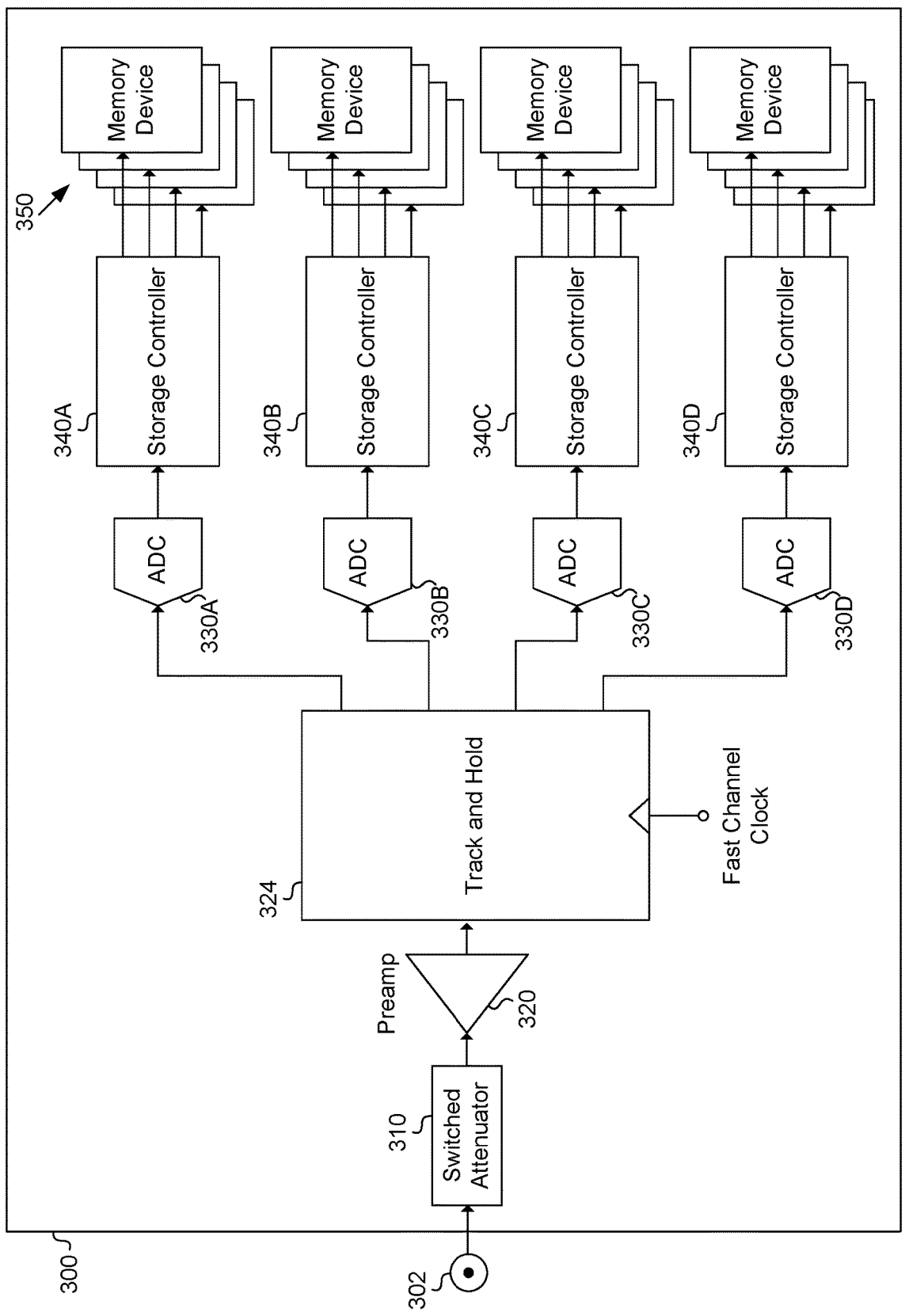
FIG. 3 is a block diagram illustrating example components of a high sample-rate input channel, according to embodiments.

FIG. 3 is a block diagram illustrating example components of a high sample-rate input channel 300, which may be an example of any of the Fast Channels of FIG. 1, according to embodiments. The input channel 300 includes some of the same or similar functional components that the input channel 200 includes, and will therefore not be described again, for brevity. Although some of the components are common between the input channel 200 of FIG. 2 and the input channel 300 of FIG. 3, the components of the input channel 300 may operate at higher frequency, or have greater bit depth or other specifications than those of the input channel 200. Differently than the input channel 200 of FIG. 2, the input channel 300 of FIG. 3 includes a track and hold circuit 324, which is a device that samples the input signal from the DUT at a given frequency and holds its value until it can be sampled by one of the ADCs 330. As described below, the track and hold circuit 324 may operate using a fast channel clock, which allows the input channel 300 to sample the input signal at a faster rate, i.e., has a higher bandwidth than the input channel 200. Also differently than the input channel 200, the input channel 300 of FIG. 3 includes multiple ADCs 330, specifically ADC 330A, ADC 330B, ADC 330C, and ADC 330D. The collection of ADCs 330 may be interleaved to support the higher bandwidth of the input channel 300. The collection of ADCs 330 may also be configured to operate at a specified data converter rate that is typically faster or higher than the ADC 230 of FIG. 2. Also, the input channel 300 includes storage controllers 340A, 340B, 340C, and 340D, which stores the output of their respective ADCs 330 into one or more memory devices 350, which may also be interleaved. The ADCs 330 of the input channel 300 may sample input signals from 1 GS/s to 100 GS/s, for example.

The input channel 300 illustrated in FIG. 3 can acquire or generate very high bandwidth signals like high-speed serial or radar signals. The input channel 300 operates at a much higher rate than the input channel 200 of FIG. 2, which is better suited for acquiring or generating power, lower speed control signals, or clocks. As illustrated in FIG. 1, embodiments of the invention include both low speed and high speed channels controlled by the same control and display functions of the control portion 150 of the instrument 100 (FIG. 1).

Figure 4:
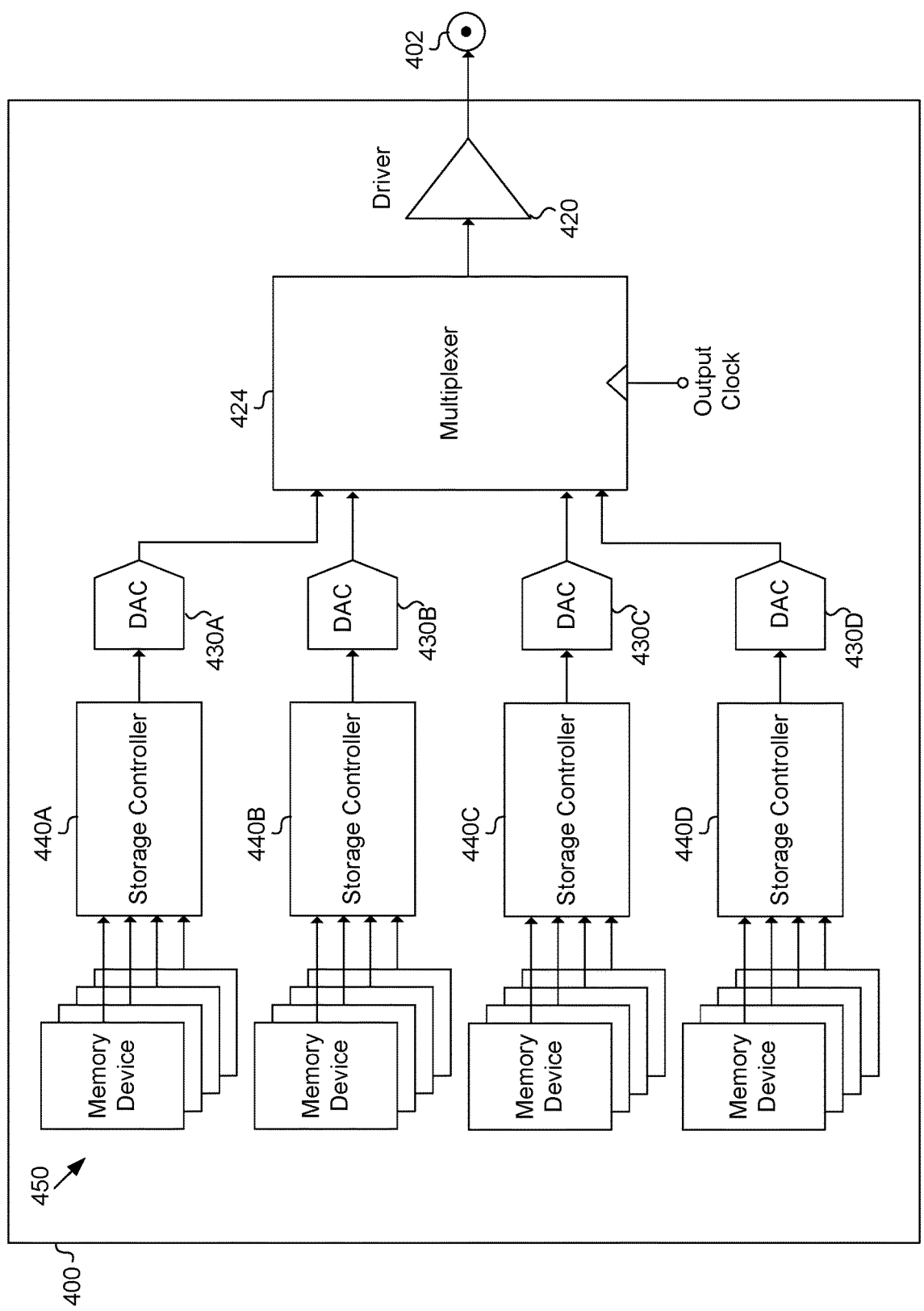
FIG. 4 is a block diagram illustrating example components of a high sample-rate output channel, according to embodiments.

Although not separately illustrated in FIG. 1, it is understood that test and measurement instruments, such as the instrument 100 of FIG. 1, or other instruments such as waveform generators, can include output channels for sending signals out of the instrument 100. FIG. 4 is a block diagram illustrating example components of a high sample-rate output channel 400, which may be an example of any of the Fast Channels of FIG. 1 according to embodiments. The high sample-rate output channel 400 operates similarly to the high speed input channel 300 of FIG. 3, except that, instead of receiving an input signal from a DUT and storing it into a memory of the instrument 100, the output channel 400 retrieves a signal previously stored in or generated by the instrument 100 and outputs it to a device through an output port 402. More specifically, a digitized waveform is stored in one or more memory devices 450, which are retrieved by one or more storage controllers 440A, 440B, 440C, and 440D. Once retrieved, the digitized waveform is presented to one or more Digital to Analog Converters (DACs) 430A, 430B, 430C, and 430D. The DACs 430A, 430B, 430C, and 430D are data converters that convert a digital signal to an analog signal. Similar to the ADCs 230, and 330, the DACs illustrated in FIG. 4 are configurable to operate at selectable speeds. From there, the analog signals are presented to a multiplexer 424, which selects the waveform, or waveform portion, from the appropriate DAC 430 and sends it to an output driver 420, which sends it to the output port 402. The multiplexer 424 operates at a speed controlled by an output clock, which is described below.

Figure 5:
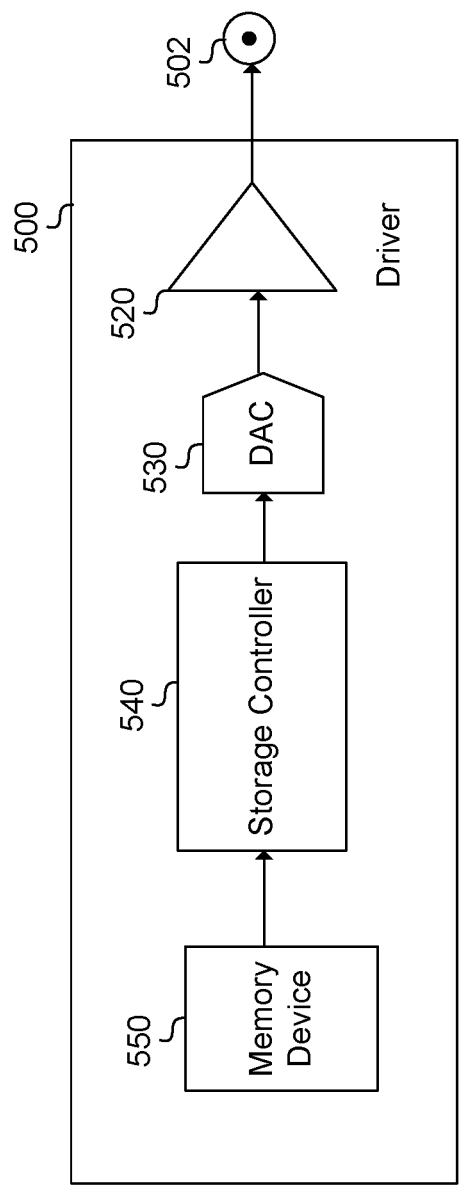
FIG. 5 is a block diagram illustrating example components of a low sample-rate output channel, according to embodiments.

FIG. 5 is a block diagram illustrating example components of a low sample-rate output channel 500, which may be an example of any of the Slow Channels of FIG. 1, according to embodiments. The low-speed output channel 500 is similar to the high-speed output channel 400 of FIG. 4, except that the low-speed output channel includes only a single memory device 550, a single storage controller 540 and a single DAC 530. A driver 520 outputs the generated signal to an output port 502. Output timing of the low-speed output channel 500 could be controlled by the sample clock driving the DAC 530 or another clocked output device in the low-speed output channel 500.

The sampling devices and data converters in the input channels 200, 300, and output channels 400, 500 are driven by sample or data clocks, which are used to set the operation speed of the particular channel. The universal timing control 120 of FIG. 1 illustrates how it generates the clocks that simultaneously control the low speed channels 200, 500, and the high-speed channels 300, 400.

Figure 6:
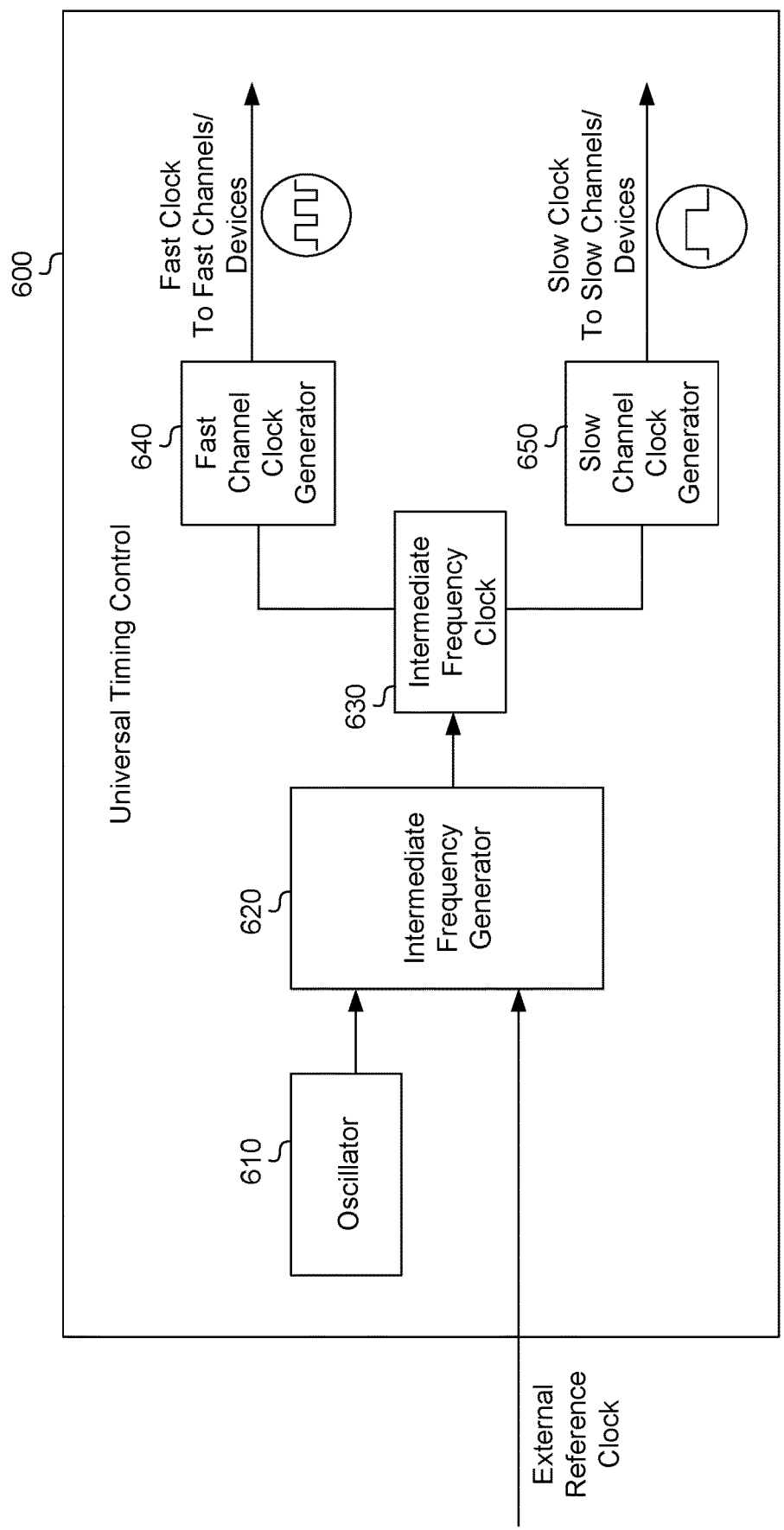
FIG. 6 is a block diagram of a universal timing controller used in a multiple sample-rate data converter according to embodiments of the disclosure.

FIG. 6 is a block diagram of a universal timing controller 600 used in a multiple sample-rate data converter according to embodiments of the disclosure. In FIG. 6, a local oscillator 610 or external reference clock is used by an intermediate frequency generator 620 to generate an intermediate frequency clock 630. Then, a fast channel clock generator 640 uses the intermediate frequency clock 630 as an input to generate a fast clock to be used by one or more components in one of the high-speed channels, as described in various examples below. Similarly, a slow channel clock generator 650 uses the same intermediate frequency clock 630 as an input to generate a slow clock to be used by one or more components in one of the low-speed channels. Each of the fast channel clock generator 640 and the slow channel clock generator 650 may use a Phase-Locked Loop (PLL), or a frequency multiplier, or other methods to generate its respective fast or slow clock signal from the intermediate frequency clock 630. Recall from above that merely using a PLL or frequency multiplier of the slow clock to generate the fast clock would generate too much jitter to accurately coordinate the samples being simultaneously received by the slow channels 200, 500 and fast channels 300, 400.

In one embodiment the oscillator 610 or external reference clock may operate between 1 MHz-20 MHz, for example 5 MHz or 10 MHz. The intermediate frequency clock 630 may operate between 50 MHz-200 MHz, for example between 80 MHz-120 MHz. In a particular example the intermediate frequency clock may operate at 97.65625 MHz. In the same example, the fast channel clock may operate at 7.8125 GHz and the slow channel clock may operate at 6.25 GHz. Thus, the fast channel clock generator 640 includes a frequency multiplier or PLL that scales or multiplies the 97.65625 MHz intermediate frequency clock 630 by a factor of 80, and the slow channel clock generator 650 includes a frequency multiplier or PLL that scales the 97.65625 MHz intermediate frequency clock 630 by a factor of 64. Of course, these specific clock frequencies are mere examples, and the slow and fast clock generators 660, 640 could scale the intermediate frequency clock 630 by other factors. In general, however, the fast channel clock generator 640 scales the intermediate frequency clock 630 by a factor of 2-400, and the slow channel clock generator 650 scales the intermediate frequency clock 630 by a factor of 1-100. Keeping these scaling factors below, for example, 1000, minimizes the jitter that would otherwise by present if the final fast and slow clocks were generated directly from the internal oscillator 610 or external reference clock, which generally have a maximum frequency of 20 MHz-50 MHz, as described above.

Referring back to FIGS. 1, 2, 3, 4 and 5, examples of how the universal timing control 600 generate the clock signals to operate the slow channels 200, 500 and fast channels 300, 400 are now presented.

In a first example, the universal timing control 600 may be used to generate fast and slow clocks to drive the sample clocks of the ADCs 230 and 330. For example, the slow channel 200 and fast channel 300 may be operating simultaneously to receive a rapidly changing input signal on the fast channel 300, and a slower-changing input signal on the slow channel 200. In these examples, the input signals received by the instrument 100 on the slow channel 200 and fast channel 300 are related to one another, so it is important to keep the sampled input waveforms correlated to one another so that tests and measurements may be made using both of the related input signals. In this example, the slow clock generated by the slow channel clock generator 650 is presented to the ADC 230 of FIG. 2, while the fast clock generated by the fast channel clock generator 640 is presented to the ADCs 330 (one or more of ADC 330A, 330B, 330C, and 330D). If present, the fast clock generated by the fast channel clock generator 640 may also be used to drive the track and hold circuit 324 of the fast channel 330. Then, when operating in concert, the waveforms being sampled on the slow channel 200 and the fast channel 300 are perfectly synchronized to one another because their clocks are also perfectly (or near perfectly) synchronized from being generated by the same intermediate frequency clock 630.

In another example, the fast clock generated by the fast channel clock generator 640 still controls the track and hold circuit 324 of the fast channel 300, but the ADCs 330 of the fast channel as well as the ADC 230 of the slow channel 200 may both be driven by the slow clock generated by the slow channel clock generator 650 (FIG. 6). In this example, even though the ADCs 230, 330 of the slow channel 200 and fast channel 300 are operating at the same clock rate, the fast channel 300 still operates at a higher bandwidth due to the faster operation of the track and hold circuit 324.

Similarly, for an output example, the fast clock generated by the fast channel clock generator 640 is used to control the output clock of the multiplexer 424 of the fast output channel 400 (FIG. 4), while the slow clock generated by the slow channel clock generator 650 is used to clock the output of the slow output channel 500. As mentioned above, any of the components of the slow channel 500, such as the memory device 550, storage controller 540, DAC 530, or driver 520, or other component, could be driven by the slow clock to control the output speed of the slow channel 500. Thus, the output waveforms of both the slow output channel 500 and the fast output channel 400 would be synchronized, even though they are operating at different frequencies.

Not only do embodiments of this disclosure operate to maintain synchronization between fast and slow input channels, as described above, concepts according to the disclosure may be used to synchronize triggering events on either of the channels to the other channel, even when the channels are operating at different frequencies.

Figure 7:
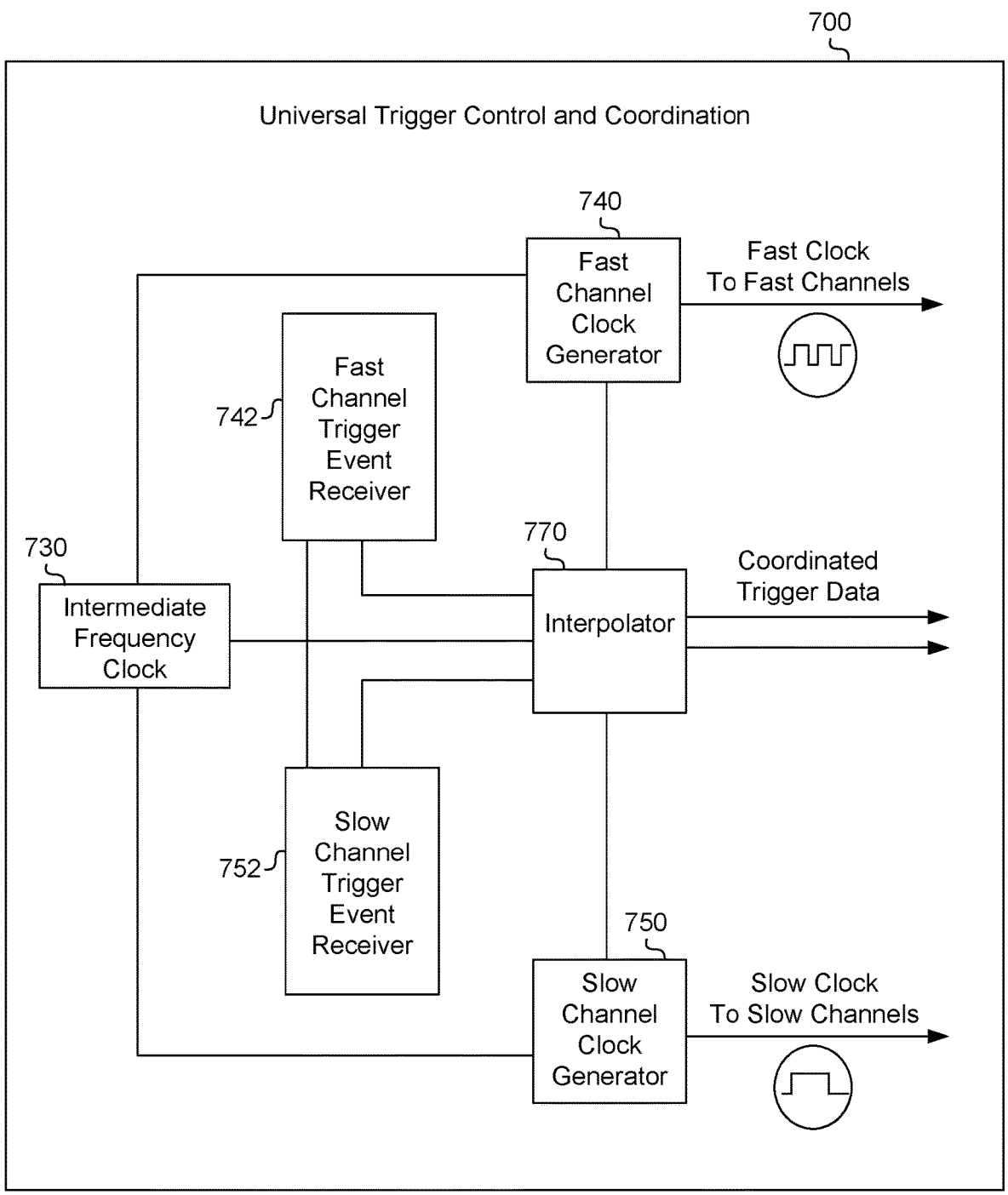
FIG. 7 is a block diagram of a universal trigger control and coordination controller used in a multiple sample-rate data converter according to embodiments of the disclosure.

FIG. 7 is a block diagram of a universal trigger control and coordination controller 700 used in a multiple sample-rate data converter according to embodiments of the disclosure. The universal trigger control and coordination controller 600 may be an example of the universal trigger control 130 of FIG. 1. In general, the universal trigger control and coordination controller 700 relates triggers that occur on one of the channels to a time reference or clock-offset reference that occurs on the other channel having a different clock rate.

In the universal trigger control and coordination controller 700 of FIG. 7, some of the components are the same or similar to the universal timing controller 600 of FIG. 6. For instance, the universal trigger control and coordination controller 700 includes an intermediate frequency clock 730, fast channel clock generator 740 and slow channel clock generator 750, which respectively correlate to the intermediate frequency clock 630, fast channel clock generator 640 and slow channel clock generator 650 of FIG. 5. In addition, the universal trigger control and coordination controller 700 may include a fast channel trigger event receiver 742, a slow channel trigger event receiver 752, and an interpolator 770. In one embodiment the trigger event receivers 742 and 752 receive trigger signals from a triggering circuit that operates elsewhere in the instrument 100 (FIG. 1.) In other embodiments the trigger event receivers 742 and 752 do not specifically receive a trigger signal, but instead operate to generate the trigger signals themselves, as understood in the art. In other embodiments, there are not actually two separate trigger event receivers 742 and 752, but rather a single receiver that is notified when a trigger event occurs in either of the slow or fast channels, or generates such a trigger. Whether the trigger event receivers 742 and 752 receive or generate trigger events is immaterial, but instead what is important is how the universal trigger control and coordination controller 700 acts after one of the triggers is generated. And, although the intermediate frequency clock 730, fast channel clock generator 740, and slow channel clock generator 750 are illustrated as different devices than those similar devices described in the universal timing control 600 of FIG. 6, it is possible that the universal trigger control and coordination controller 700 is merely coupled to the same devices used in the universal timing control 600, rather than including them in the universal trigger control and coordination controller 700.

In a first example of trigger coordination between channels having different operating frequencies, a traditional, analog trigger system may be used across different sample rate channels since the trigger system does not actually operate on sample data, but rather operates using traditional triggering methods. In this first example, trigger event locations on each of the fast and slow channels are generated independently, and operate to generate trigger locations relative to and between sample clocks of each of the slow and fast sample clocks. Thus, when either the fast channel trigger event receiver 742 or the slow channel trigger event receiver 752, or both, determines a trigger event has occurred, a trigger event location is generated for the triggering event relative to both of its respective sample clocks. The trigger event location may be generated by an interpolator 770, which determines the particular clock cycle or cycles of the particular clock for the channel. In other words, a trigger event location is generated by the interpolator 770 relative to both the fast clock as well as the slow clock. This coordinated trigger data is sent to the processor 170 (FIG. 1) or to another specialized trigger processor so that the trigger event locations may be stored with or indexed to particular locations in the stored waveforms.

In other examples, the trigger event may be time-stamped and interpolated on one of the sample rate channels relative to the common frequency between the two systems, i.e., relative to the position of the intermediate frequency clock 730. This trigger time stamp can be of arbitrarily high resolution depending on the capability of a time interpolator circuit 770. The trigger time-stamp is thus known with high precision relative to the sample intervals on both channels.

In another example, if a digital trigger system is used by the instrument 100 and such a trigger event is contained in only one sample rate set of channels, the interpolator 770 may operate to determine trigger positions for the channels at the different sample rate for each of the channels, following the same principle described above for the analog trigger where the trigger is time-stamped relative to a common frequency from the intermediate frequency clock 730. The interpolator 770 may be configured to automatically generate trigger positions for both of the channels no matter which of the channels, i.e., either one of the high speed channels or one of the low speed channels generated the trigger. In another embodiment, one of the trigger event receivers 742, 752 could notify the other trigger receiver, which then instructs the interpolator 770 to generate the trigger location data for the particular channel. In this embodiment, the interpolator 770 may generate trigger location data for either or both of the high-speed channel and the low-speed channel, depending on the configuration of the interpolator 770.

In another example, if a trigger event has inputs of more than one sample rate, then the interpolator 770 may be configured to interpolate the trigger data to a common sample rate, such as the rate of the intermediate frequency clock 730. In other embodiments, the interpolator 770 may generate the trigger location data for either of the slow channel or the fast channel, wherever the trigger occurred, and then scale-up or scale-down the trigger location data for the other channel. So, if a trigger occurred in a slow channel, the interpolator 770 would first generate the trigger location data relative to the slow clock, and then scale-up the determined trigger location data to a reference of the fast clock by using the appropriate scaling factor of the slow channel rate to the fast channel rate. Such an action could also work in reverse, where the interpolator 770 first interpolates the trigger location data to the fast clock, and then scales down a trigger location relative to the slow clock. In this example, the interpolator 770 may choose the closest edge of the slow clock to where the trigger event occurred. Or, the interpolator 770 may generate a time offset to the closest slow clock edge. For example, if the trigger event occurred at an edge of the fast clock that is approximately 30% into the duty cycle of the nearest slow clock edge, the interpolator 770 may record the trigger location as occurring at the preceding clock edge plus a time offset that represents the 30% of the duty cycle. In other embodiments, the interpolator 770 may use the higher frequency clock as a reference for triggering events in both of the fast and the slow channels. In yet other embodiments, the interpolator 770 may generate timestamps for the trigger locations in both of the fast and slow channels.

Referring back to FIG. 1, the universal storage control 140 may operate similar to the universal timing control 600 of FIG. 6, except that the universal storage control 140 would be configured to specifically control timing of the storage controllers 240, 340, 440, and 540, rather than controlling other components of the high-speed and low-speed channels, as described above.

Figure 8:
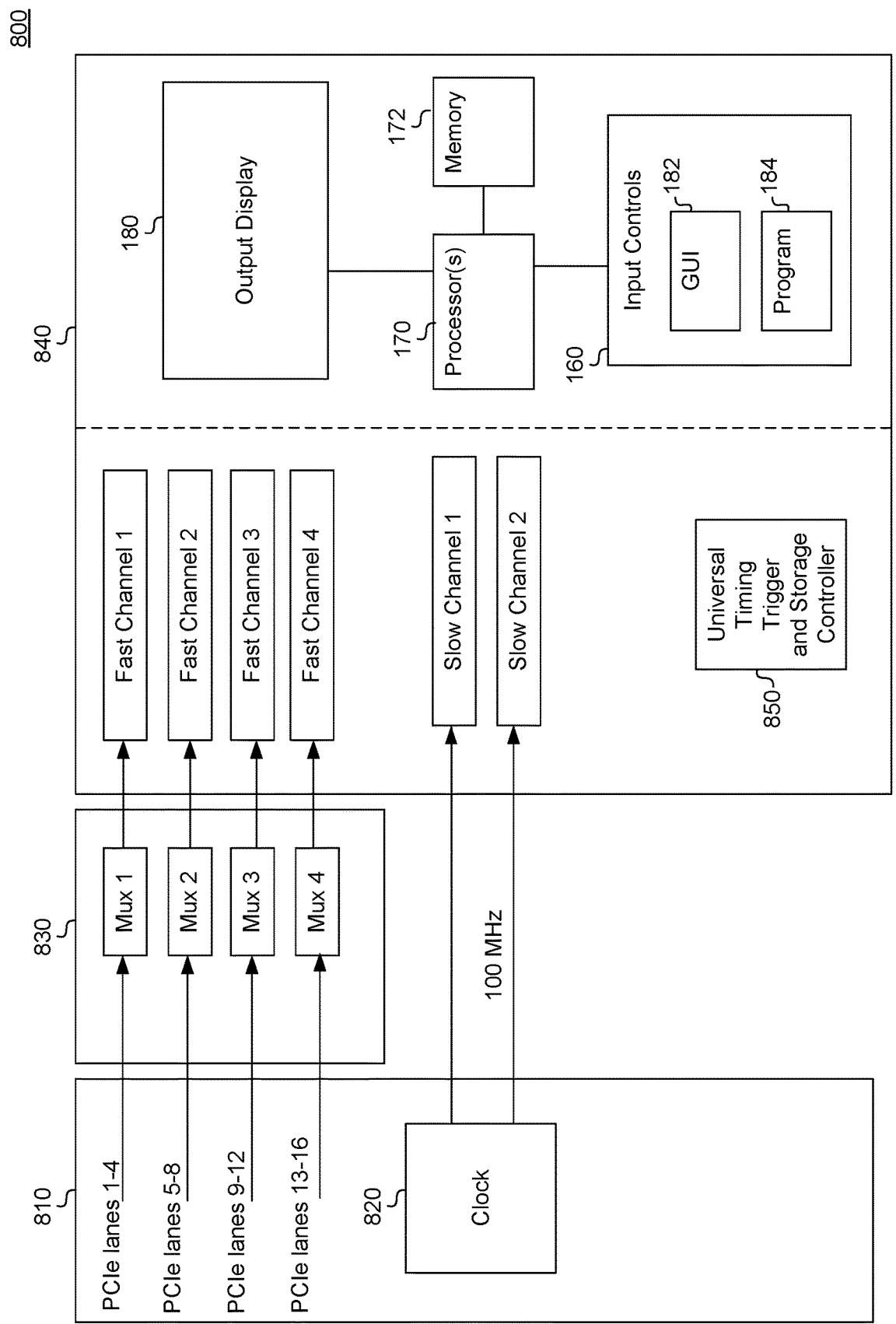
FIG. 8 is a block diagram illustrating a test and measurement instrument having multiple low sample-rate input channels and multiple high sample-rate input channels coupled to a DUT having both high and low speed outputs according to embodiments of the disclosure.

FIG. 8 is a block diagram illustrating an example of testing system 800 for testing a DUT 810 that outputs signals that are related to one another but operate at different frequencies. For example, the DUT 810 may be a PCIe (Peripheral Control Interconnect Express) device that generates high-speed signals on lanes 1-16, and that also generates lower speed clock signals from a clock 820 that is related to the high-speed signals. In this testing system 800, a programmable input selector 830 selects which of the particular channels 1-16 are presented to a test and measurement device 840 for testing. The test and measurement device 840 may be an example of the test and measurement device 100 including channels capable of accepting signals at different sampling rates, as described above. The user programs or operates the input selector 830 to control which of the lanes 1-16 is coupled to the test and measurement device 840 at any given time. Such an input selector 830 is described in U.S. patent application Ser. No. 17/832,535, titled Multi-Input Remote Heads for Sequential Testing, filed Jun. 3, 2022, and is incorporated by reference herein. The clock signals from the clock 820 of the DUT 810 are also presented to the test and measurement device 840.

In this example testing system 800, the PCIe lanes 1-16 may be sampled at, for example, 50 GS/s, while the clock signal generated by the clock 820 may be sampled at only 1 GS/s or less. It is desirable, however, that the clock signals be captured at the same time as, and related to, the data contained in the PCIe lanes 1-16. Using a conventional instrument that includes all channels operating at the same sampling rate to test the DUT 810 would be inefficient, as the signals from the PCIe lanes 1-16 and the clock 820 would all be sampled at the same rate. Using embodiments according to this disclosure, however, allow the clock signals to be sampled at a much lower rate on one or both of the slow channels, Slow Channel 1 and Slow Channel 2, while the PCIe lanes 1-16 may be sampled on the fast channels, Fast Channel 1, Fast Channel 2, Fast Channel 3 and Fast Channel 4, using the methods described above. According to the PCIe 6.0 specification, at least as of Revision 4.0, the reference 100 MHz reference clock itself has relatively low jitter requirements, which are as low as less than 500 fs (femptoseconds). Embodiments of the invention, as described above, provide a mechanism for measuring clock jitter on both the PCIe lanes 1-16, using the Fast Chanels 1-4, as well as for measuring clock jitter on the reference clock, using the Slow Channels 1-2, in a related manner, as samples from the Fast Channels and the Slow channels are all generated with a common intermediate frequency clock, such as the intermediate frequency clock 630 of FIG. 6. A universal timing, trigger, and storage controller 850 may include the functionality of the universal timing control 120, universal trigger control 130, and universal storage control 140 described above.

In operation, data sent from particular ones of the PCIe lanes 1-16 are selected using the input selector 830 and presented to the test and measurement device 840 on the fast channels for testing. The clock signals from the DUT 810 are also sent to the test and measurement device 840 and are presented to the slow channels. Data from the slow channels and fast channels are correlated in the test and measurement device 840, as described above. Trigger events that occur on either the slow channels or fast channels, or both may also be correlated to one another. The different signals may be retrieved from storage and displayed together on the display 180, and controlled using the common input controls 160, as described above. Further, the stored waveform data may be retrieved from the various memories, linked together through the related clocks, and presented as output data using fast output channels and slow output channels, as described above.

Although described above with reference to a test and measurement instrument, such as an oscilloscope, the principles of time and trigger alignment described above apply equally to other types of devices, such as instruments that contain both ADC and DAC channels. Or, the principals of operation also apply to waveform generator systems that produce output signals having different output rates. For example, the trigger time stamp information can be used to start or stop the sequencing of a waveform on the DAC channel.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is test and measurement instrument, comprising a first data channel including a first data converter configurable to operate at a first rate and a second data channel including a second data converter configurable to operate at a second rate that is different than the first rate.

Example 2 is a test and measurement instrument according to Example 1, further comprising a clock generation circuit, including an intermediate frequency generator structured to generate an intermediate frequency clock from a first clock reference signal, a first frequency clock generator structured to generate a first frequency clock directly from the intermediate frequency clock, the first frequency clock coupled to the first data converter to cause the first data channel to operate at the first rate, and a second frequency clock generator structured to generate a second frequency clock directly from the intermediate frequency clock, the second frequency clock coupled to the second data converter to cause the second data channel to operate at the second rate.

Example 3 is a test and measurement instrument according to any of the previous Examples, further comprising a trigger indexing system structured to correlate a trigger event on one of the first data channel or second data channel to the other of the first data channel or second data channel.

Example 4 is a test and measurement instrument according to any of the previous Examples, in which the trigger indexing system generates trigger correlation data that is stored in conjunction with data stored from the first data channel, the second data channel, or both the first data channel and the second data channel.

Example 5 is a test and measurement instrument according to Examples 3 or 4, in which the trigger indexing system generates time-stamp data.

Example 6 is a test and measurement instrument according to any of the Examples 3-5, further comprising a trigger indexing system structured to correlate a trigger event on one of the first data channel or second data channel to the other of the first data channel or second data channel, in which the trigger indexing system generates data related to the first frequency clock.

Example 7 is a is a test and measurement instrument according to any of the Examples 3-6, in which the trigger indexing system generates data related to the first frequency clock as well as generates data related to the second frequency clock.

Example 8 is a is a test and measurement instrument according to any of the Examples 3-7, in which the trigger indexing system generates data related to the second frequency clock as well as an offset value to a clock edge of the second frequency clock.

Example 9 is a test and measurement instrument according to any of the Examples 2-8, in which the first frequency clock generator comprises a Phase-Locked Loop or a frequency multiplier.

Example 10 is a test and measurement instrument according to any of the Examples 2-9, in which the first frequency clock generator is structured to scale the intermediate frequency clock by a factor less than 1000.

Example 11 is a test and measurement instrument according to any of the Examples 2-10, in which the first frequency clock generator is structured to scale the intermediate frequency clock by a factor less than 100.

Example 12 is a test and measurement instrument according to any of the Examples 2-11, in which the first frequency clock generator is structured to scale the intermediate frequency clock by a first factor, and in which the second frequency clock generator is structured to scale the intermediate frequency clock by a second factor that is different than the first factor.

Example 13 is a test and measurement instrument according to any of the above Examples, in which the first data channel and the second data channel are input channels, or in which the first data channel and the second data channel are output channels.

Example 14 is a test and measurement instrument according to any of the Examples 2-13, in which the first clock reference signal is an oscillator internal to the test and measurement instrument, or in which the first clock reference signal is received at the test and measurement instrument from an external device.

Example 15 is a method in test and measurement instrument, comprising receiving a first input signal from a device under test at a first sampling rate on a first input channel and receiving a second input signal from the device under test at a second sampling rate on a second input channel.

Example 16 is a method according to Example 15, further comprising generating an intermediate frequency clock from a first clock reference signal, generating a first frequency clock directly from the intermediate frequency clock, applying the first frequency clock to the first input channel to cause the first input channel to operate at the first sampling rate, generating a second frequency clock directly from the intermediate frequency clock, the second frequency clock having a different rate than the first frequency clock, and applying the second frequency clock to the second input channel to cause the second input channel to operate at the second sampling rate.

Example 17 is a method according to Examples 15-16, further comprising correlating a trigger event that occurs on one of the first or second channels to both of the first and second channels.

Example 18 is a method according to Example 17, in which correlating a trigger event that occurs on one of the first or second channels comprises generating trigger correlation data that is stored in conjunction with data stored from the input channel, the second input channel, or both the first input channel and the second input channel.

Example 19 is a method according to Example 17-18, in which correlating a trigger event comprises generating time-stamp data.

Example 20 is a method according to any of Examples 15-19, further comprising correlating a trigger event that occurs on one of the first or second channels to both of the first and second channels, and in which in which generating trigger correlation data comprises generating data related to the first frequency clock.

Example 21 is a method according to Examples 17-20, in which generating trigger correlation data comprises generating data related to the second frequency clock and an offset value related to a clock edge of the second frequency clock.

Example 22 is a method according to Examples 16-21, in which generating the first frequency clock comprises scaling the intermediate frequency clock to a first scaling factor less than 100, and in which generating the second frequency clock comprises scaling the intermediate frequency clock to a second scaling factor less than the first scaling factor.

Example 23 is a method in test and measurement instrument, comprising generating a first output signal at a first rate on a first output channel, and generating a second output signal at a second rate on a second output channel.

Example 24 is a method according to Example 23, further comprising generating an intermediate frequency clock from a first clock reference signal, generating a first frequency clock directly from the intermediate frequency clock, applying the first frequency clock to the first output channel to cause the first output channel to operate at the first rate, generating a second frequency clock directly from the intermediate frequency clock, the second frequency clock having a different rate than the first frequency clock, and applying the second frequency clock to the second output channel to cause the second output channel to operate at the second rate.

Example 25 is a method according to Example 24, in which generating the first frequency clock comprises scaling the intermediate frequency clock to a first scaling factor less than 100, and in which generating the second frequency clock comprises scaling the intermediate frequency clock to a second scaling factor less than the first scaling factor.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement instrument, comprising:
   a user interface having an input selector structured to accept an indication of a test channel or channels from a user;
   an input of the test and measurement instrument configured to receive a signal from a device under test, a portion of the signal including data from the one or more test channel inputs selected by the user for sampling;
   a first data channel of the input including a first data converter configurable to operate at a first sampling rate;
   a second data channel of the input including a second data converter configurable to operate at a second sampling rate that is different than the first sampling rate;
   a clock generation circuit, including:
      an intermediate frequency generator structured to generate an intermediate frequency clock from a first clock reference signal, an operational frequency of the intermediate frequency clock being different from an operational frequency of the first clock reference signal;
      a first frequency clock generator structured to generate a first frequency clock directly from the intermediate frequency clock, the first frequency clock coupled to the first data converter to cause the first data channel to operate at the first sampling rate to sample and store the signal from the device under test as a first sampled waveform, and
      a second frequency clock generator structured to generate a second frequency clock directly from the intermediate frequency clock, the second frequency clock coupled to the second data converter to cause the second data channel to operate at the second sampling rate to sample and store the signal from the device under test as a second sampled waveform; and
   an output configured to send an output signal to a display, the output signal including output derived from the first sampled waveform and the second sampled waveform.

2. The test and measurement instrument according to claim 1, further comprising a trigger indexing system structured to correlate a trigger event on one of the first data channel or second data channel to the other of the first data channel or second data channel.

3. The test and measurement instrument according to claim 2, in which the trigger indexing system generates trigger correlation data that is stored in conjunction with data stored from the first data channel, the second data channel, or both the first data channel and the second data channel.

4. The test and measurement instrument according to claim 2, in which the trigger indexing system generates time-stamp data.

5. The test and measurement instrument according to claim 1, further comprising a trigger indexing system structured to correlate a trigger event on one of the first data channel or second data channel to the other of the first data channel or second data channel, in which the trigger indexing system generates data related to the first frequency clock.

6. The test and measurement instrument according to claim 5, in which the trigger indexing system generates data related to the first frequency clock as well as generates data related to the second frequency clock.

7. The test and measurement instrument according to claim 5, in which the trigger indexing system generates data related to the second frequency clock as well as an offset value to a clock edge of the second frequency clock.

8. The test and measurement instrument according to claim 1, in which the first frequency clock generator comprises a Phase-Locked Loop or a frequency multiplier.

9. The test and measurement instrument according to claim 1, in which the first frequency clock generator is structured to scale the intermediate frequency clock by a factor less than 1000.

10. The test and measurement instrument according to claim 1, in which the first frequency clock generator is structured to scale the intermediate frequency clock by a factor less than 100.

11. The test and measurement instrument according to claim 1, in which the first frequency clock generator is structured to scale the intermediate frequency clock by a first factor, and in which the second frequency clock generator is structured to scale the intermediate frequency clock by a second factor that is different than the first factor.

12. The test and measurement instrument according to claim 1, in which the first data channel and the second data channel are input channels, or in which the first data channel and the second data channel are output channels.

13. The test and measurement instrument according to claim 1, in which the first clock reference signal is an oscillator internal to the test and measurement instrument, or in which the first clock reference signal is received at the test and measurement instrument from an external device.

14. A method in test and measurement instrument, comprising:
- receiving a first input signal from a device under test at a first sampling rate on a first input channel of the test and measurement instrument, a portion of the first input signal including data from one or more channels of the device under test selected by a user for sampling via an input selector;
- receiving a second input signal from the device under test at a second sampling rate on a second input channel of the test and measurement instrument; and
- generating an intermediate frequency clock from a first clock reference signal, an operational frequency of the intermediate frequency clock being different from an operational frequency of the first clock reference signal;
- generating a first frequency clock directly from the intermediate frequency clock;
- applying the first frequency clock to the first input channel to cause the first input channel to operate at the first sampling rate to sample and store the first input signal from the device under test as a first sampled waveform;
- generating a second frequency clock directly from the intermediate frequency clock, the second frequency clock having a different rate than the first frequency clock; and
- applying the second frequency clock to the second input channel to cause the second input channel to operate at the second sampling rate to sample and store the second input signal from the device under test as a second sampled waveform; and
- sending an output signal to a display, the output signal including output derived from both the first sampled waveform and the second sampled waveform.

15. The method according to claim 14, further comprising correlating a trigger event that occurs on one of the first or second channels to both of the first and second channels.

16. The method according to claim 15, in which correlating a trigger event that occurs on one of the first or second channels comprises generating trigger correlation data that is stored in conjunction with data stored from the input channel, the second input channel, or both the first input channel and the second input channel.

17. The method according to claim 15, in which correlating a trigger event comprises generating time-stamp data.

18. The method according to claim 14, further comprising correlating a trigger event that occurs on one of the first or second channels to both of the first and second channels, and in which in which generating trigger correlation data comprises generating data related to the first frequency clock.

19. The method according to claim 18, in which generating trigger correlation data comprises generating data related to the second frequency clock and an offset value related to a clock edge of the second frequency clock.

20. The method according to claim 14, in which generating the first frequency clock comprises scaling the intermediate frequency clock to a first scaling factor less than 100, and in which generating the second frequency clock comprises scaling the intermediate frequency clock to a second scaling factor less than the first scaling factor.

21. The test and measurement instrument according to claim 1, in which the portion of the signal including data from one or more channels of the device under test selected by a user is sampled at the first sampling rate and is included in the output signal.

22. The test and measurement instrument according to claim 1, in which the portion of the signal including data from one or more channels of the device under test comprises high-speed signals from one or more lanes of a peripheral control interconnect express (PCIe) device.

23. The test and measurement instrument according to claim 22, in which the first clock reference signal comprises a low-speed clock signal received from the PCIe device.

24. The method according to claim 14, in which sending the output signal to the display comprises sending the portion of the first input signal selected by the user and sampled at the first sampling rate.

25. The method according to claim 14, in which receiving a first input signal from a device under test comprises receiving high-speed signals from one or more lanes of a peripheral control interconnect express (PCIe) device.

26. The method according to claim 25, in which generating an intermediate frequency clock from the first clock reference signal comprises generating an intermediate frequency clock from a low-speed clock signal received from the PCIe device.

* * * * *